United States Patent
Sung et al.

(10) Patent No.: US 10,643,847 B2
(45) Date of Patent: May 5, 2020

(54) FUNCTIONALIZED GRAPHENE STRUCTURE AND METHOD FOR MANUFACTURING THE SAME

(71) Applicant: IUCF-HYU (INDUSTRY-UNIVERSITY COOPERATION FOUNDATION HANYANG UNIVERSITY), Seoul (KR)

(72) Inventors: Myung Mo Sung, Seoul (KR); Kyu-Seok Han, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 15/958,538

(22) Filed: Apr. 20, 2018

(65) Prior Publication Data
US 2018/0247816 A1    Aug. 30, 2018

Related U.S. Application Data

(63) Continuation of application No. PCT/KR2016/011870, filed on Oct. 21, 2016.

(30) Foreign Application Priority Data

Oct. 22, 2015    (KR) .................. 10-2015-0147652

(51) Int. Cl.
*H01L 21/04*    (2006.01)
*C23C 16/02*    (2006.01)
(Continued)

(52) U.S. Cl.
CPC ........ *H01L 21/041* (2013.01); *C23C 16/0209* (2013.01); *C23C 16/0272* (2013.01);
(Continued)

(58) Field of Classification Search
None
See application file for complete search history.

(56) References Cited

U.S. PATENT DOCUMENTS

| 8,481,421 B2 | 7/2013 | Goddard et al. |
| 2010/0258786 A1 | 10/2010 | Wang et al. |

(Continued)

FOREIGN PATENT DOCUMENTS

| CN | 102906015 A | 1/2013 |
| KR | 1020130128220 A | 11/2013 |

OTHER PUBLICATIONS

Xinran Wang et al., "Atomic Layer Deposition of Metal Oxides on Pristine and Functionalized Graphene", J. AM. Chem. SOC., 2008, pp. 8152-8153, vol. 130, No. 26.

(Continued)

*Primary Examiner* — Michelle Mandala
(74) *Attorney, Agent, or Firm* — Sughrue Mion, PLLC

(57) ABSTRACT

A method for manufacturing a functionalized graphene structure includes preparing a substrate having a graphene layer, forming an organic linker layer by providing an organic linker on the graphene layer, and forming a dopant layer by providing a dopant material including a metal on the organic linker layer. The organic linker layer and the dopant layer are formed in-situ.

15 Claims, 21 Drawing Sheets

(51) Int. Cl.
  *C23C 28/04* (2006.01)
  *C23C 16/40* (2006.01)
  *C23C 28/00* (2006.01)
  *C23C 16/26* (2006.01)
  *C23C 16/455* (2006.01)
  *H01L 29/16* (2006.01)
  *H01L 29/167* (2006.01)
  *H01L 21/306* (2006.01)
  *H01L 29/786* (2006.01)

(52) U.S. Cl.
  CPC ............ *C23C 16/26* (2013.01); *C23C 16/407* (2013.01); *C23C 16/45525* (2013.01); *C23C 28/00* (2013.01); *C23C 28/04* (2013.01); *H01L 29/1606* (2013.01); *H01L 29/167* (2013.01); *H01L 21/306* (2013.01); *H01L 29/78684* (2013.01)

(56) References Cited

U.S. PATENT DOCUMENTS

2011/0104507 A1\* 5/2011 Choi .......................... B32B 9/04
  428/500
2014/0234627 A1\* 8/2014 Yang ......................... H01B 1/04
  428/408
2014/0327838 A1\* 11/2014 Li ........................... G06F 1/1692
  349/12

OTHER PUBLICATIONS

International Search Report for PCT/KR2016/011870, dated Jan. 11, 2017.

\* cited by examiner

[FIG. 1]
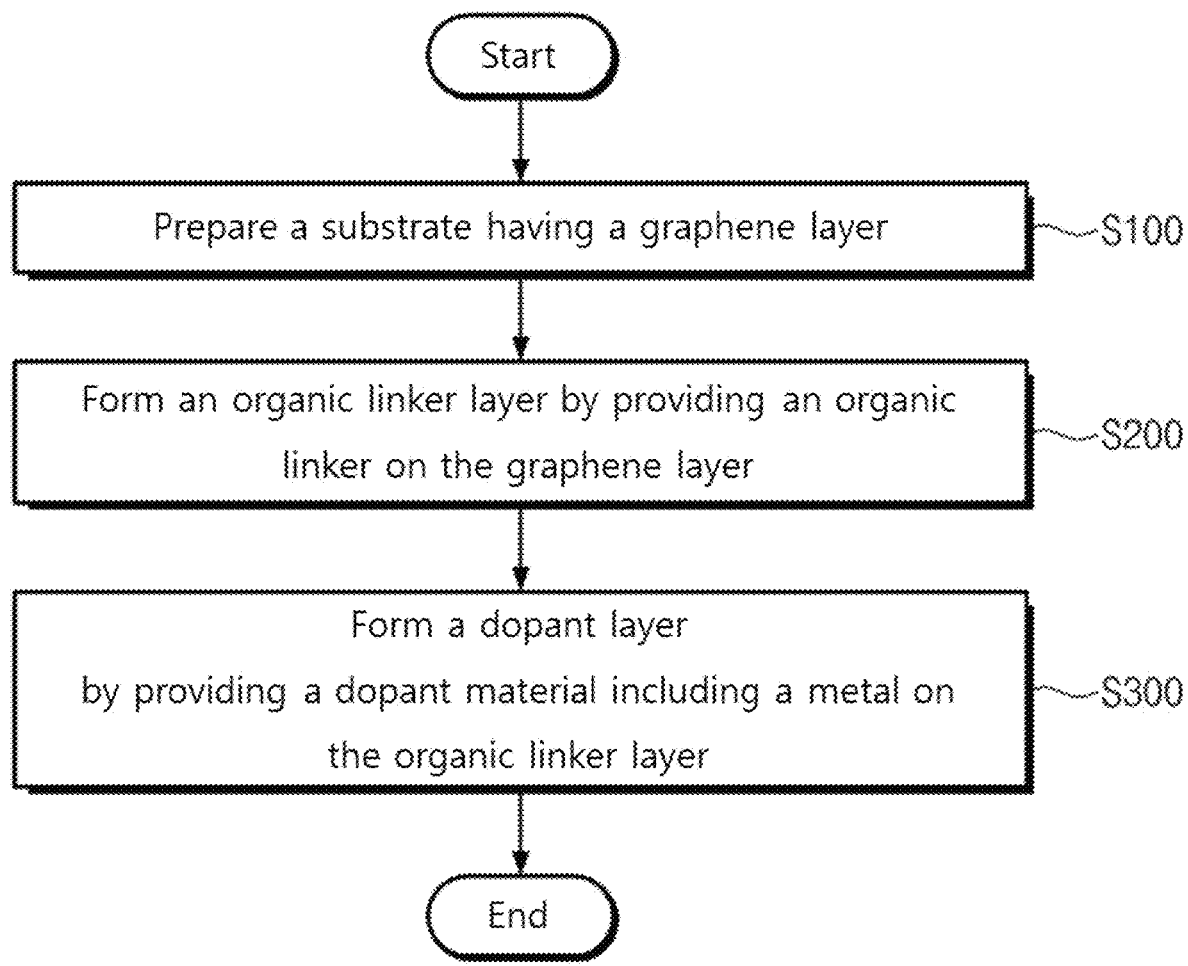

[FIG. 2]
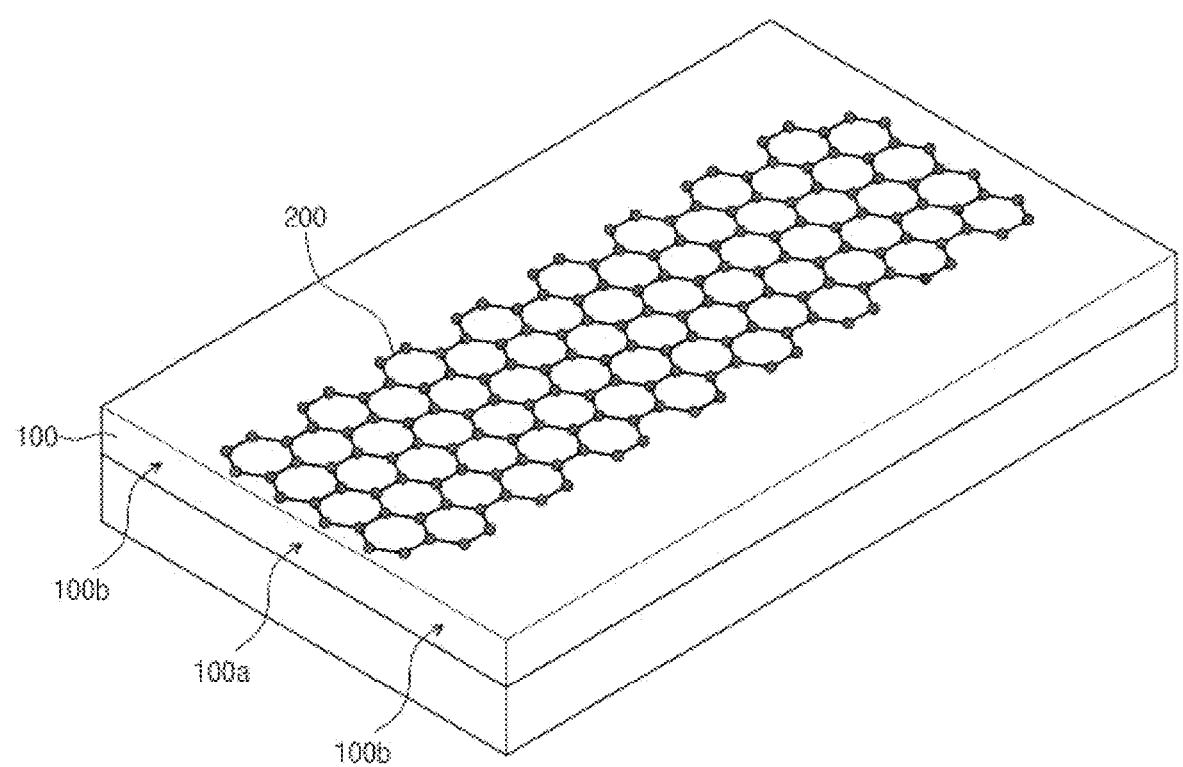

[FIG. 3]
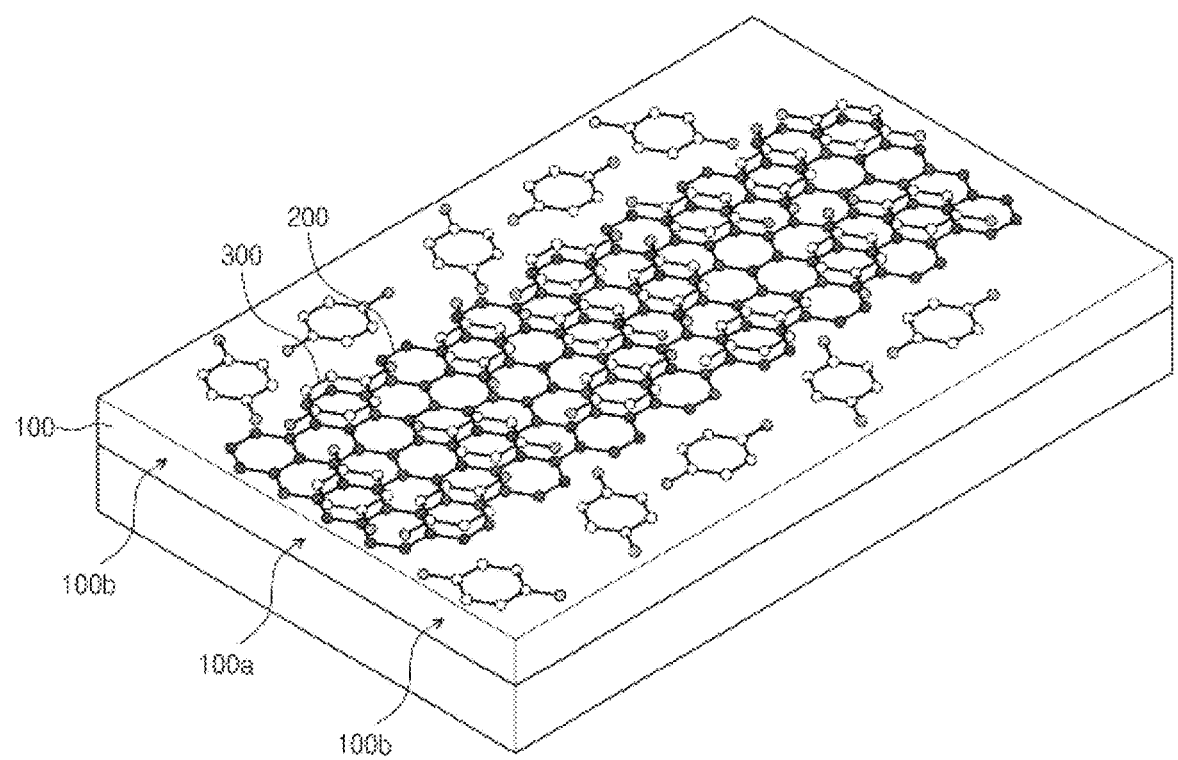

[FIG. 4]
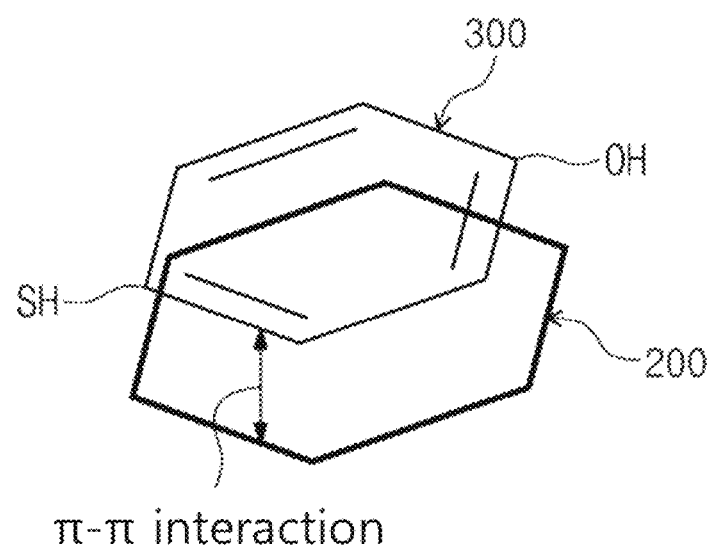
π-π interaction

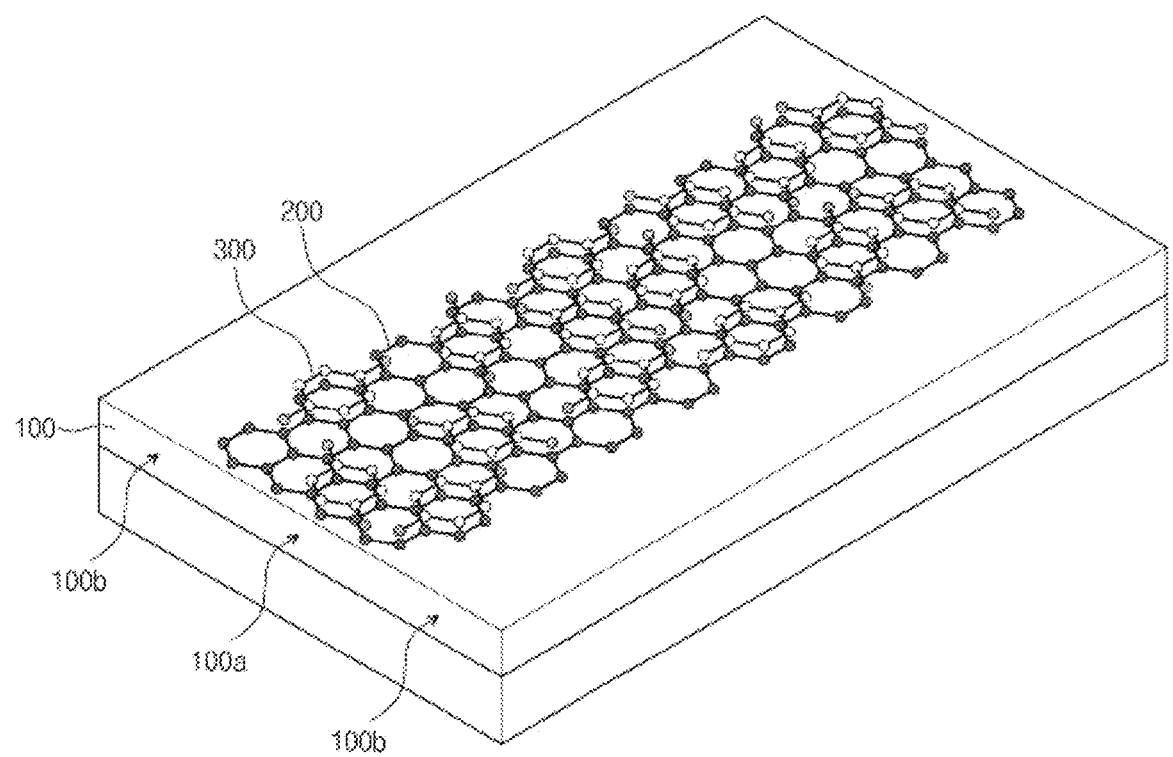
[FIG. 5]

[FIG. 6]
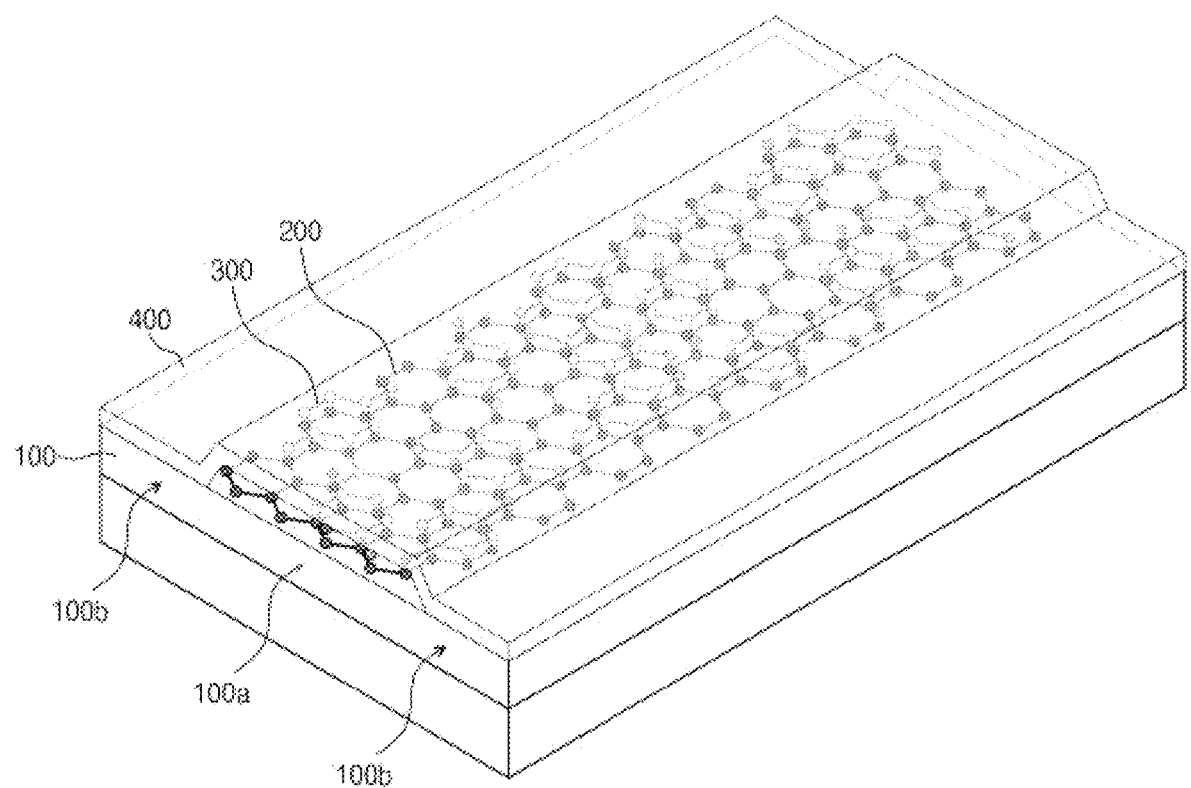

[FIG. 7]
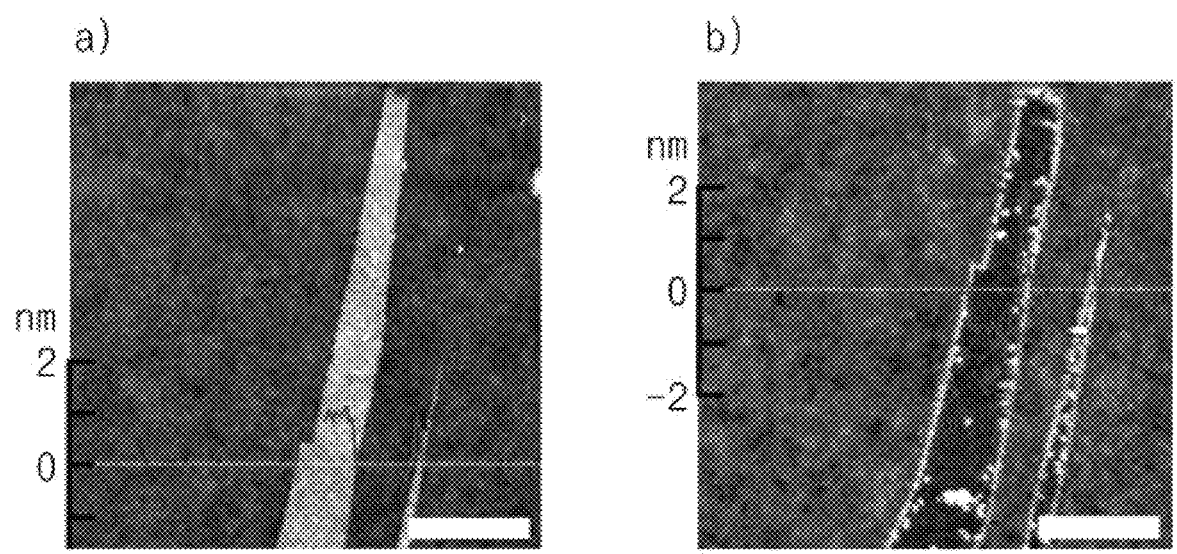

[FIG. 8]
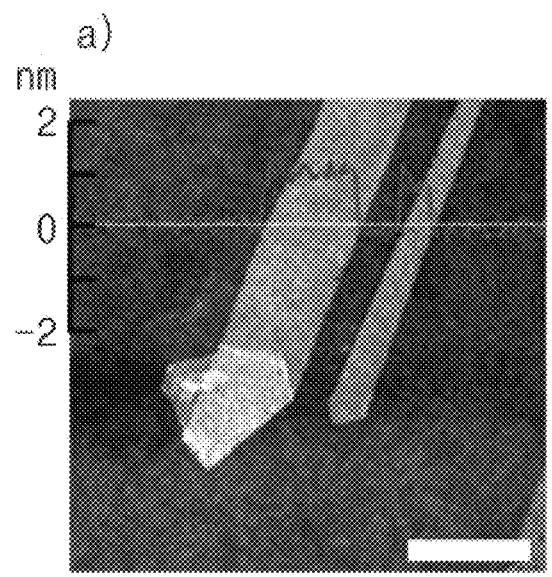 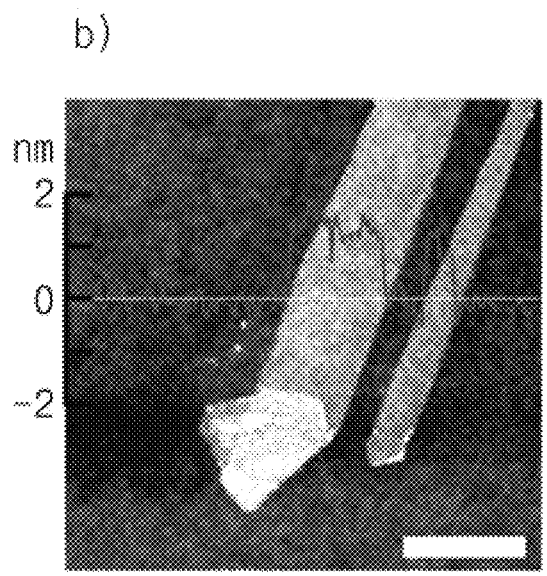

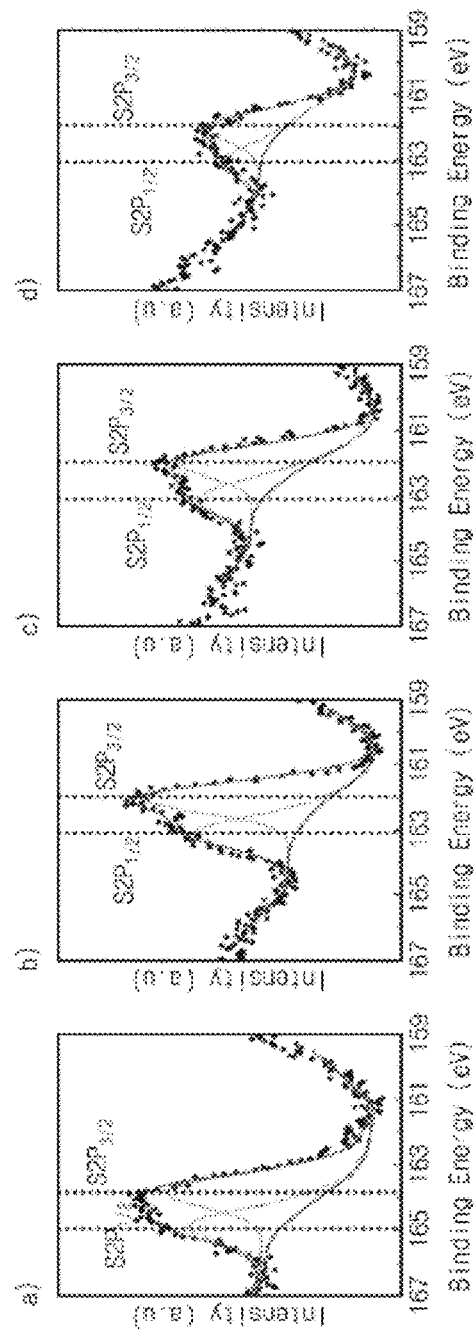
[FIG. 9]

[FIG. 10]
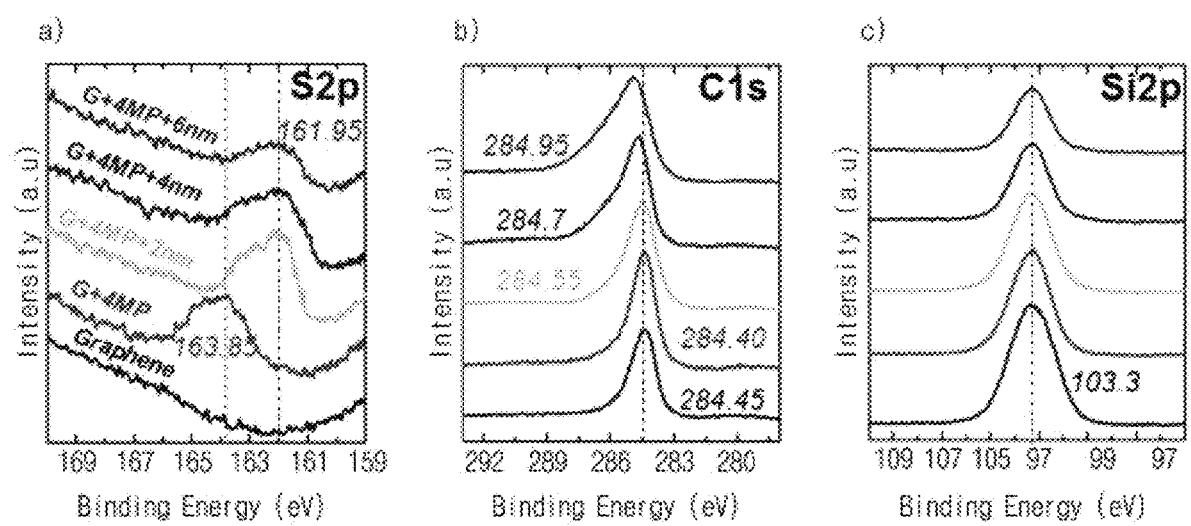

[FIG. 11]
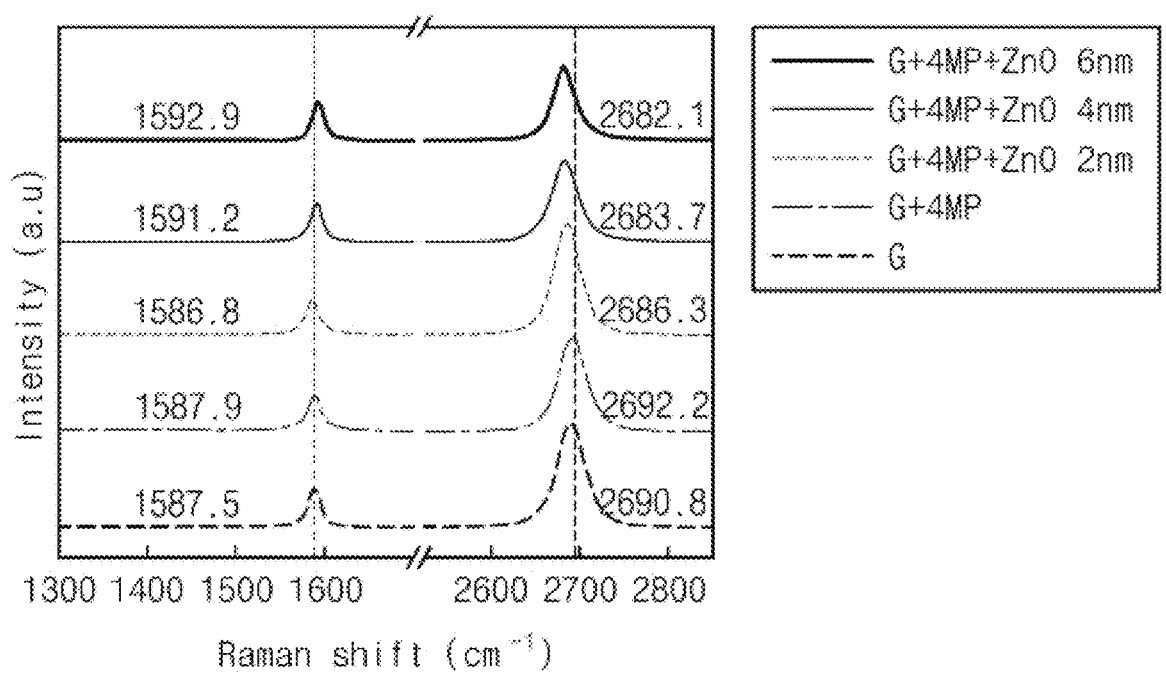

[FIG. 12]
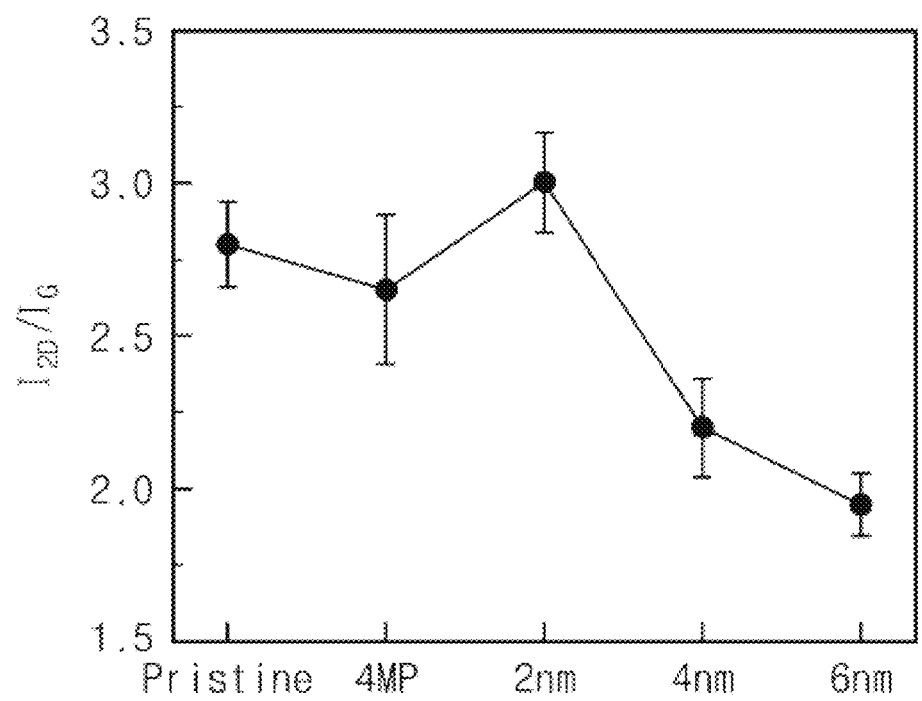

[FIG. 13]
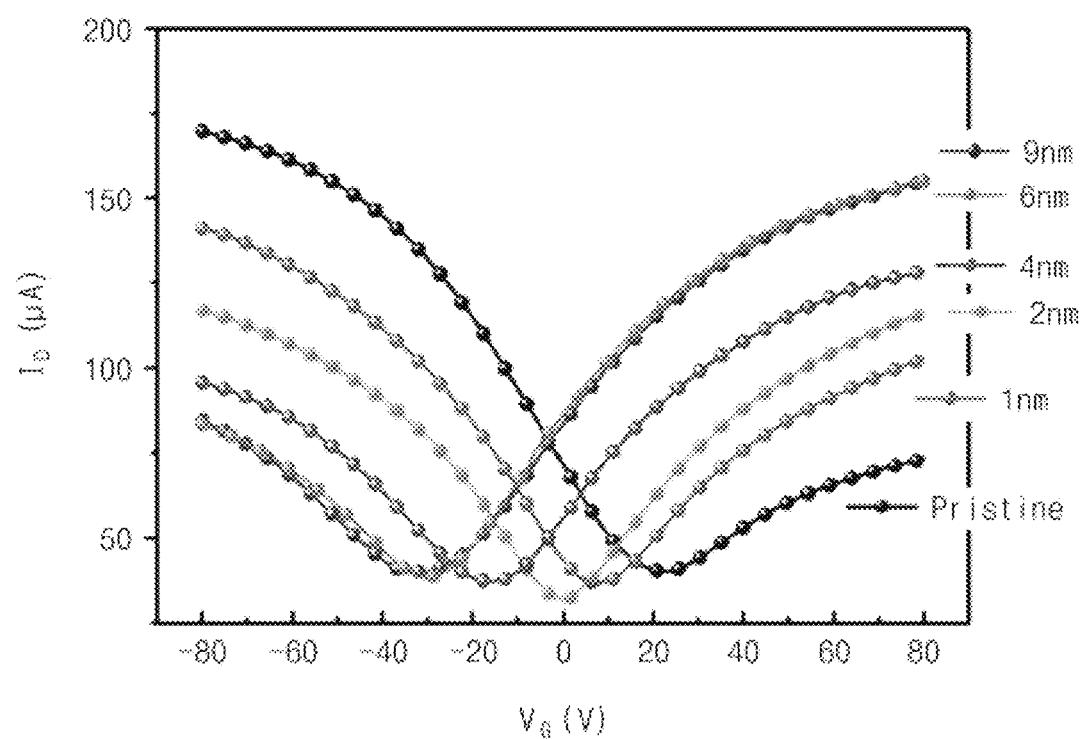

[FIG. 14]
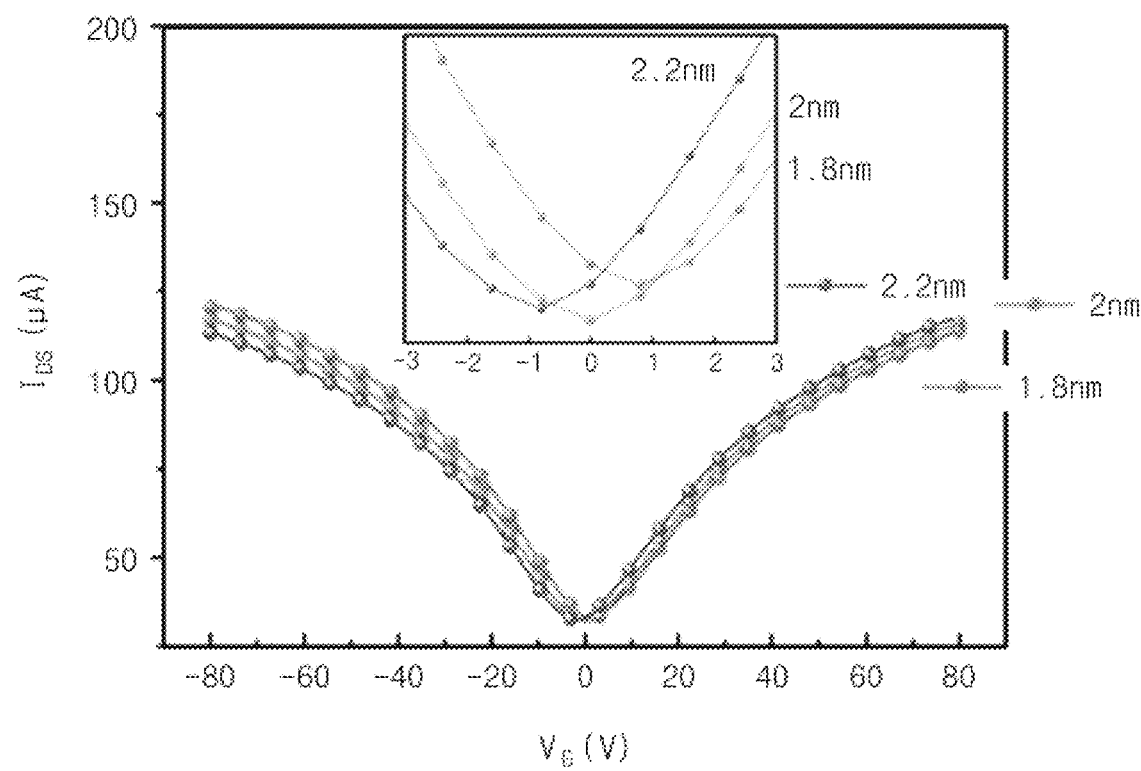

[FIG. 15]
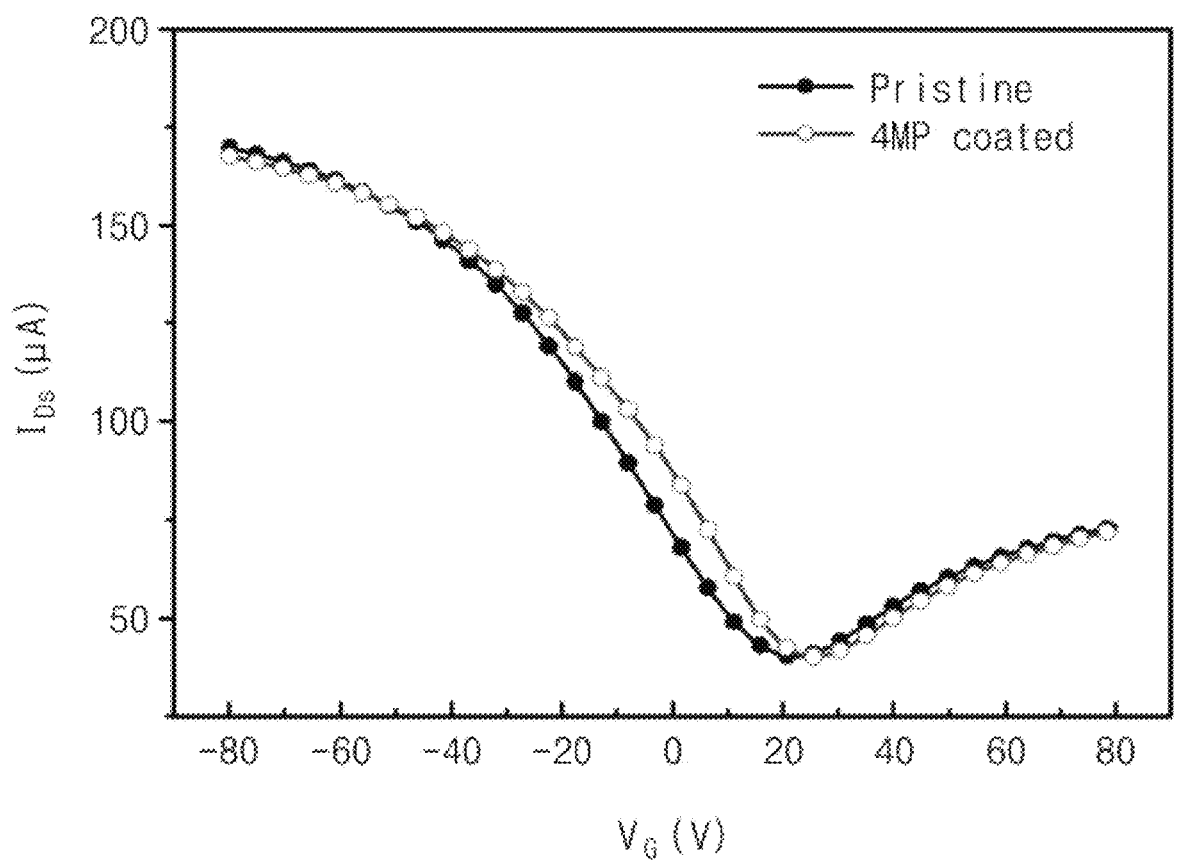

[FIG. 16]
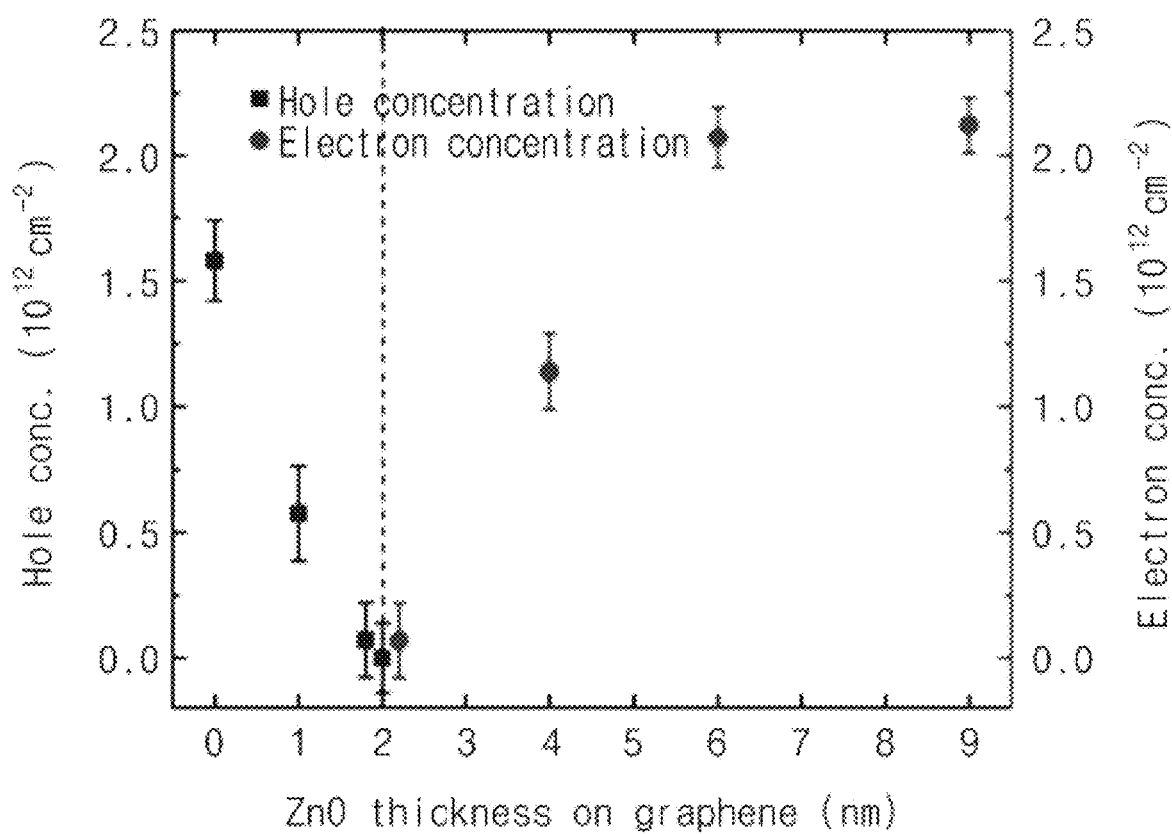

[FIG. 17]
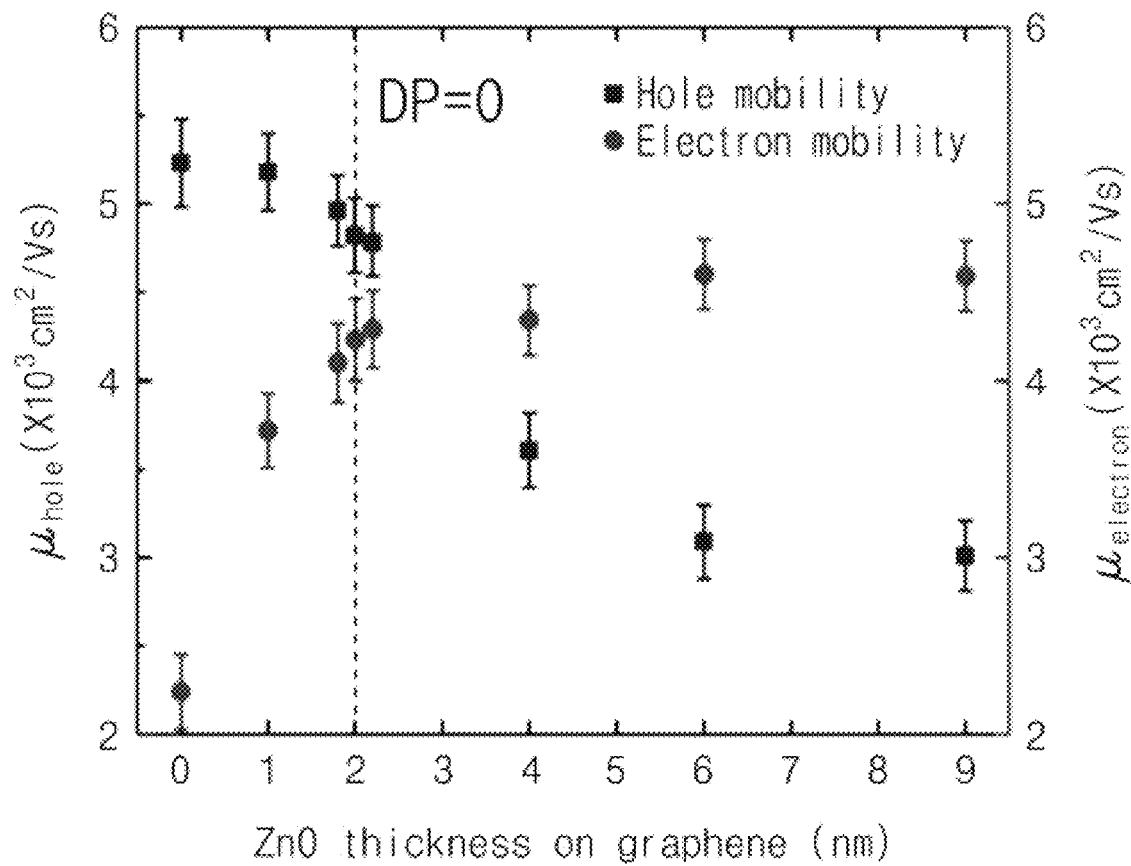

[FIG. 18]
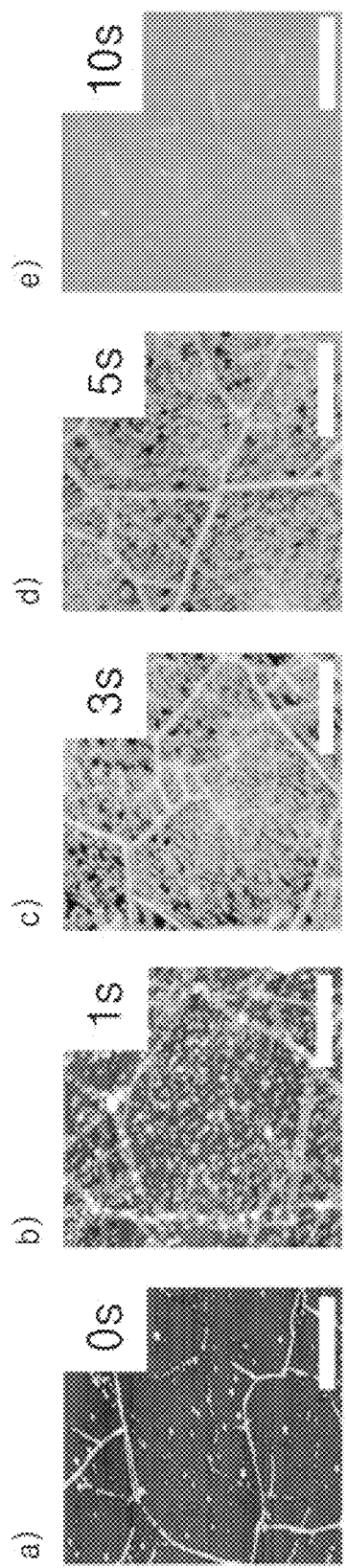

[FIG. 19]
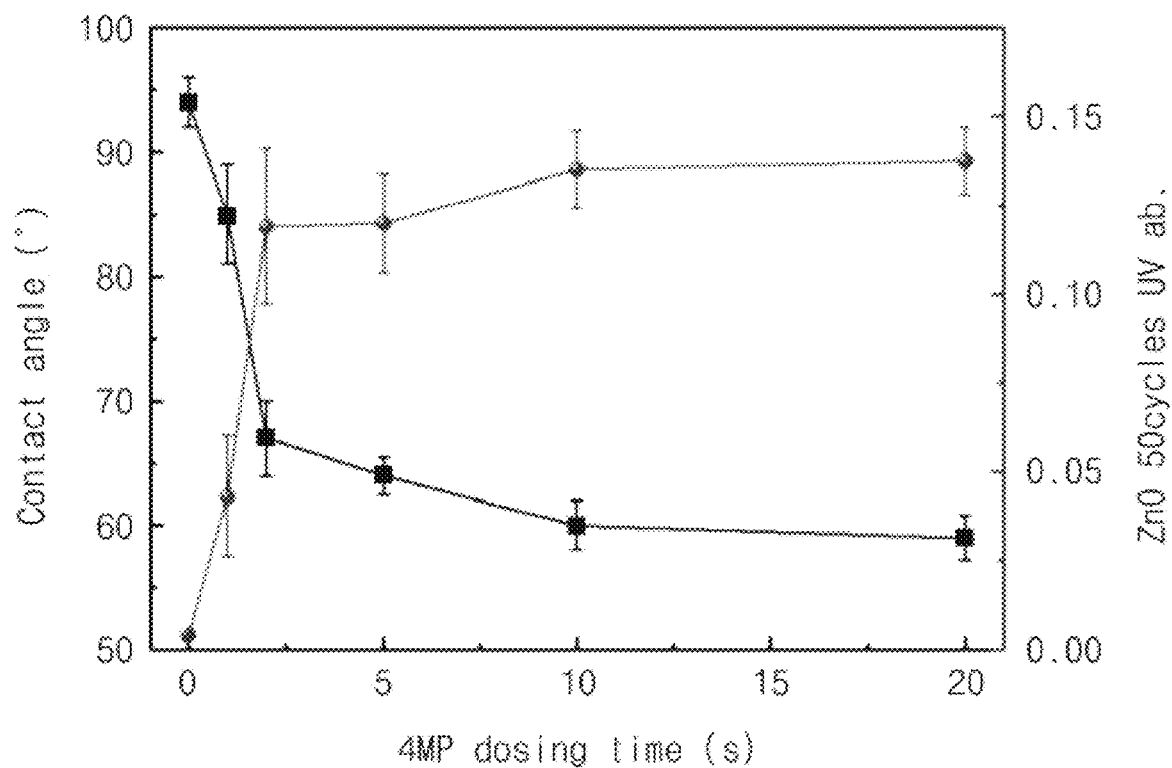

[FIG. 20]
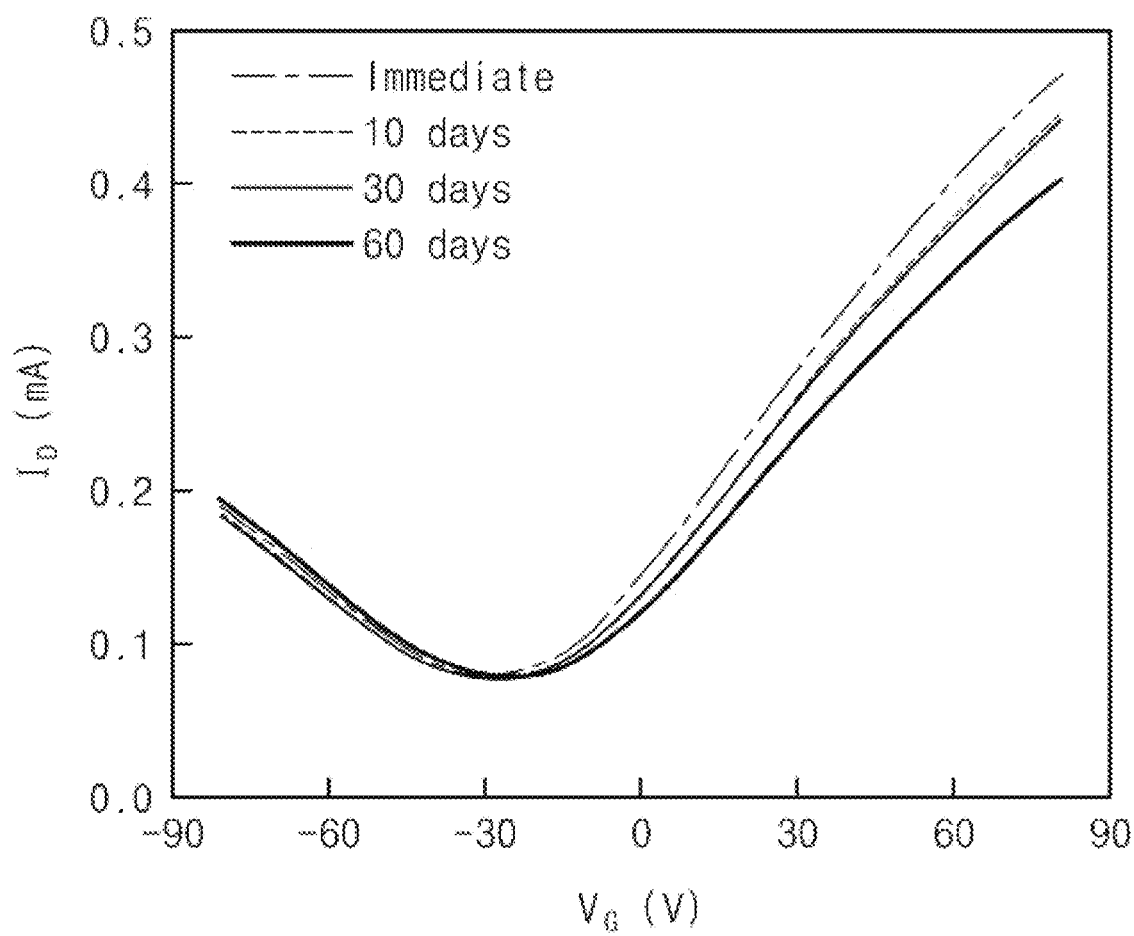

[FIG. 21]
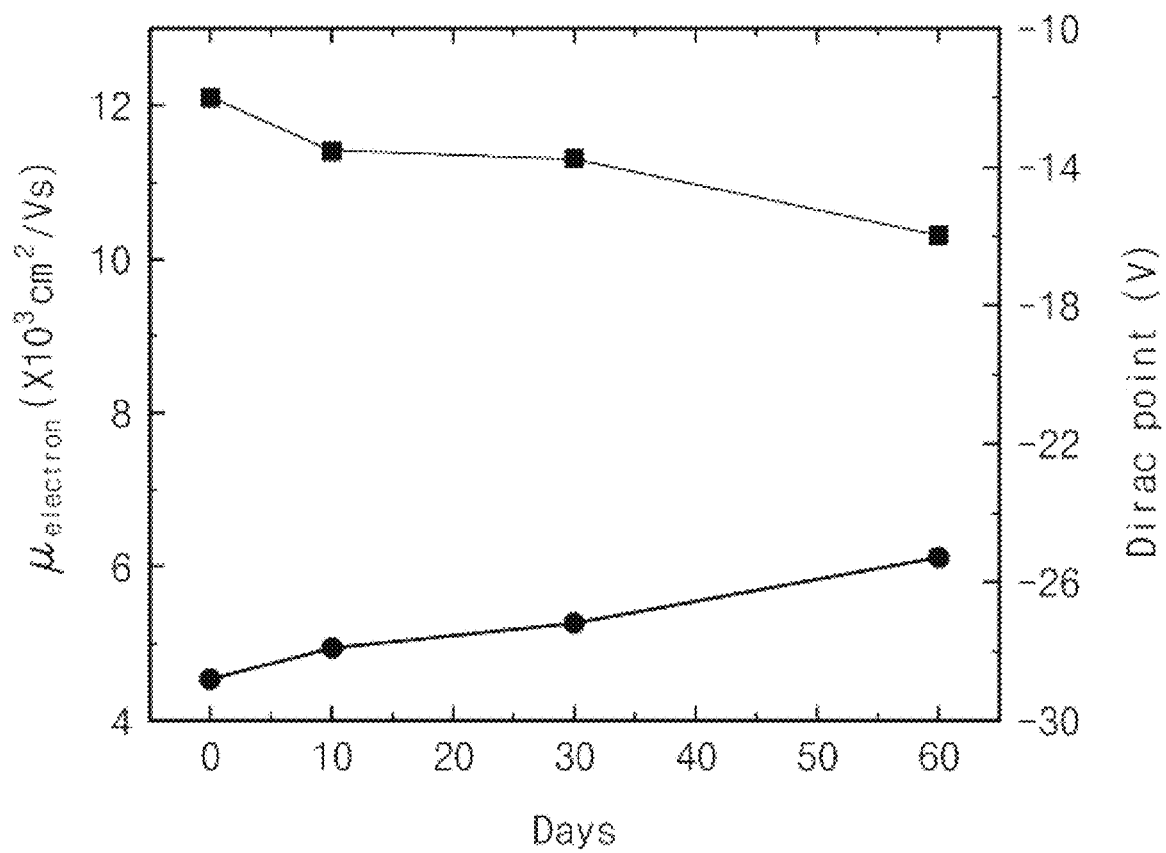

FUNCTIONALIZED GRAPHENE STRUCTURE AND METHOD FOR MANUFACTURING THE SAME

CROSS-REFERENCE TO RELATED APPLICATION

This application is a continuation of pending International Application No. PCT/KR2016/011870, which was filed on Oct. 21, 2016 and claims priority to Korean Patent Application No. 10-2015-0147652, filed on Oct. 22, 2015, in the Korean Intellectual Property Office, the disclosures of which are hereby incorporated by reference in their entireties.

BACKGROUND

1. Field

The present disclosure relates to a functionalized graphene structure and a method for manufacturing the same, and more particularly, to a functionalized graphene structure including an organic linker layer disposed on a graphene layer and a dopant layer disposed on the organic linker layer, and a method for manufacturing the same.

2. Description of the Related Art

Graphene is a material which has excellent strength, excellent thermal conductivity, and excellent electron mobility. Thus, the graphene has been recognized as a core material capable of leading the growth of various fields such as displays, secondary batteries, solar cells, automobiles and lighting, and techniques for commercializing the graphene have been studied.

Thus, techniques for securing excellent characteristics of the graphene have been actively developed using a mechanical lamination method, a chemical lamination method, a lamination-reinsertion-expansion method, a chemical vapor deposition method, an epitaxial synthesis method, and/or a chemical synthesis method.

For example, Korean Patent Publication No. KR20130009070A (Application No. KR20110069886A) discloses a method of manufacturing graphite having a functionalized edge by mechanically pulverizing graphite in a gas atmosphere having one or more of air, methane, ethane, carbon monoxide, and carbon dioxide. In this method, a weight ratio of the edge of a functional group to a gross weight of the functionalized graphite ranges from 0.01 wt % to 50 wt %, and thus a kind and a degree of the functional group attached to the edge of the graphite may be verified. Accordingly, secondary reaction using the graphite having the functionalized edge may be predicted, and physical and electrical characteristics of the graphite having the functionalized edge are superior to those of a conventional graphite oxide.

To apply the graphene having excellent electrical and physical characteristics to electronic devices such as a diode, a sensor, and a transistor, it is required to study or develop a graphene structure capable of easily adjusting the electrical and physical characteristics of the graphene.

SUMMARY

Embodiments of the inventive concepts may provide a functionalized graphene structure capable of adjusting electrical characteristics and a method for manufacturing the same.

Embodiments of the inventive concepts may also provide a functionalized graphene structure capable of adjusting physical characteristics and a method for manufacturing the same.

Embodiments of the inventive concepts may further provide a functionalized graphene structure capable of improving an electron mobility and a method for manufacturing the same.

Embodiments of the inventive concepts may further provide a functionalized graphene structure capable of improving optical characteristics and a method for manufacturing the same.

Embodiments of the inventive concepts may further provide a functionalized graphene structure capable of improving air stability and a method for manufacturing the same.

Embodiments of the inventive concepts may further provide a functionalized graphene structure capable of reducing a process time and a process cost and a method for manufacturing the same.

In an aspect, a method for manufacturing a functionalized graphene structure may include preparing a substrate having a graphene layer, forming an organic linker layer by providing an organic linker on the graphene layer, and forming a dopant layer by providing a dopant material including a metal on the organic linker layer. The organic linker layer and the dopant layer may be formed in-situ.

In an embodiment, the graphene layer may be functionalized by the organic linker layer such that the dopant layer is conformally formed on the graphene layer.

In an embodiment, the organic linker may be an aromatic element having a thiol group and a hydroxyl group.

In an embodiment, the organic linker may be 4-mercaptophenol (4MP).

In an embodiment, sulfur (S) included in the thiol group and oxygen (O) included in the hydroxyl group of the organic linker may be combined with the metal included in the dopant layer.

In an embodiment, the substrate may include a first portion on which the graphene layer is provided, and a second portion on which the graphene layer is not provided. The forming of the organic linker layer by providing the organic linker on the graphene layer may include forming the organic linker layer on the graphene layer and the second portion.

In an embodiment, the organic linker layer formed on the second portion may be removed by a purge process before the dopant material is provided on the organic linker layer by an atomic layer deposition (ALD) process, and the organic linker layer on the graphene layer may remain after the purge process.

In an embodiment, the dopant material including the metal may include zinc.

In an embodiment, the forming of the dopant layer may include adjusting a thickness of the dopant layer in the unit of angstrom.

In an embodiment, a contact angle of the dopant layer with respect to water may decrease as a time for which the organic linker is provided on the graphene layer increases.

In an embodiment, an absorbance of the dopant layer with respect to ultraviolet (UV) may increase as a time for which the organic linker is provided on the graphene layer increases.

In another aspect, a functionalized graphene structure may include a substrate, a graphene layer on the substrate, an organic linker layer disposed on the graphene layer and having a π-π interaction with the graphene layer, and a dopant layer on the organic linker layer.

In an embodiment, the organic linker layer may be selectively provided between the graphene layer and the dopant layer.

In an embodiment, the substrate may include a first portion on which the graphene layer is provided, and a second portion on which the graphene layer is not provided. The dopant layer may be provided on the first portion and the second portion of the substrate.

In an embodiment, a Fermi level of the graphene layer may be adjusted according to a thickness of the dopant layer.

BRIEF DESCRIPTION OF THE DRAWINGS

FIG. 1 is a flowchart illustrating a method for manufacturing a functionalized graphene structure according to an embodiment of the inventive concepts.

FIG. 2 is a perspective view illustrating a process of preparing a substrate having a graphene layer in the method for manufacturing the functionalized graphene structure according to an embodiment of the inventive concepts.

FIG. 3 is a perspective view illustrating a process of forming an organic linker layer in the method for manufacturing the functionalized graphene structure according to an embodiment of the inventive concepts.

FIG. 4 is a schematic view illustrating a π-π interaction between the graphene layer and the organic linker layer of the functionalized graphene structure according to an embodiment of the inventive concepts.

FIG. 5 is a perspective view illustrating a process of removing the organic linker layer, which is formed on a portion of the substrate where the graphene layer is not provided, by a purge process in the method for manufacturing the functionalized graphene structure according to an embodiment of the inventive concepts.

FIG. 6 is a perspective view illustrating a process of forming a dopant layer in the method for manufacturing the functionalized graphene structure according to an embodiment of the inventive concepts.

FIG. 7 shows atomic force microscope (AFM) images of a graphene structure in which a dopant layer is formed on a graphene layer where an organic linker layer is not formed.

FIG. 8 shows AFM images of a functionalized graphene structure in which a dopant layer is formed on a graphene layer where an organic linker layer is formed.

FIG. 9 shows X-ray photoelectron spectroscopy (XPS) graphs of a graphene structure having an organic linker layer and a functionalized graphene structure.

FIG. 10 shows XPS graphs of a graphene structure in which an organic linker layer is not formed, a graphene structure in which an organic linker layer is formed, and a functionalized graphene structure.

FIG. 11 shows a Raman spectra graph of a graphene structure in which an organic linker layer is not formed, a graphene structure in which an organic linker layer is formed, and a functionalized graphene structure.

FIG. 12 is a graph showing $I_{2D}/I_G$ in Raman spectra of a graphene structure in which an organic linker layer is not formed, a graphene structure in which an organic linker layer is formed, and a functionalized graphene structure.

FIG. 13 is a graph showing transfer curves of graphene thin film transistors (TFTs) in which thicknesses of dopant layers of functionalized graphene structures according to embodiments of the inventive concepts are 0 nm, 1 nm, 2 nm, 4 nm, 6 nm, and 9 nm, respectively.

FIG. 14 is a graph showing transfer curves of graphene TFTs in which thicknesses of dopant layers of functionalized graphene structures according to embodiments of the inventive concepts are 1.8 nm, 2 nm, and 2.2 nm, respectively.

FIG. 15 is a graph showing a transfer curve of a graphene TFT manufactured using a graphene structure in which an organic linker layer is formed.

FIG. 16 is a graph showing a hole concentration and an electron concentration according to a thickness of a dopant layer of a functionalized graphene structure.

FIG. 17 is a graph showing a hole mobility and an electron mobility according to a thickness of a dopant layer of a functionalized graphene structure.

FIG. 18 shows AFM images of a functionalized graphene structure according to a time of an organic linker surface treatment.

FIG. 19 is a graph showing a water contact angle of a graphene layer according to a time of an organic linker surface treatment and an UV-VIS absorbance of a functionalized graphene structure according to the time of the organic linker surface treatment.

FIG. 20 is a graph showing a drain current $I_D$ versus a gate voltage $V_G$ over time of a graphene TFT.

FIG. 21 is a graph showing an electron mobility and $V_{Dirac}$ over time of a graphene TFT.

DETAILED DESCRIPTION OF THE EMBODIMENTS

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present invention, the descriptions to the elements and functions of related arts may be omitted if they obscure the subjects of the inventive concepts.

FIG. 1 is a flowchart illustrating a method for manufacturing a functionalized graphene structure according to an embodiment of the inventive concepts, and FIGS. 2 to 6 are views illustrating a method for manufacturing a functionalized graphene structure according to an embodiment of the inventive concepts.

Referring to FIGS. 1 and 2, a substrate 100 having a graphene layer 200 is prepared (S100). The substrate 100 may include a first portion 100a on which the graphene layer 200 is provided, and a second portion 100b on which the graphene layer 200 is not provided. In detail, the substrate 100 may include the first portion 100a on which the graphene layer 200 is formed, and the second portion 100b on which the graphene layer 200 is not formed and of which a top surface is exposed.

For example, the graphene layer 200 may be selectively provided on the substrate 100 by a scotch tape method. Kish graphite may be mechanically cut using an adhesive tape to obtain monolayer graphene flakes on an adhesive surface of the tape. The monolayer graphene flakes adhered to the adhesive surface of the tape may be transferred onto the substrate 100. Thus, the substrate 100 may be prepared to include the first portion 100a on which the monolayer graphene flakes (i.e., the graphene layer 200) are provided, and the second portion 100b on which the monolayer graphene flakes (i.e., the graphene layer 200) are not provided. When the graphene layer 200 is selectively provided on the substrate 100 by the scotch tape method as described above, the substrate 100 having the graphene layer 200 may be annealed at 350 degrees Celsius for 1 hour in an argon gas environment to remove a remaining material of the adhesive tape and/or a contaminant, which are generated on a surface of the graphene layer 200.

Alternatively, in another embodiment, the graphene layer 200 may be provided on the substrate 100 by a chemical vapor deposition (CVD) method.

According to an embodiment, the substrate 100 may be a silicon-based substrate. For example, the substrate 100 may be a $SiO_2$/p+Si wafer. Alternatively, in another embodiment, the substrate 100 may be a compound semiconductor substrate, a glass substrate, a plastic substrate, or a metal substrate. The substrate 100 may be flexible.

Referring to FIGS. 1, 3 and 4, an organic linker layer 300 may be formed by providing an organic linker on the graphene layer 200 (S200). In detail, the organic linker layer 300 may be formed on the graphene layer 200 in an atomic layer deposition (ALD) chamber by a vapor deposition process. The organic linker layer 300 may be formed on the graphene layer 200 and the second portion 100b on which the graphene layer 200 is not provided.

The organic linker may be an aromatic element having a thiol group and a hydroxyl group. According to an embodiment, the organic linker may be 4-mercaptophenol (4MP). In this case, a vapor deposition temperature of 4-mercaptophenol (4MP) of the organic linker may be 85 degrees Celsius. Alternatively, in other embodiments, the organic linker may be one of alcohols and carboxylic acids, which include an aromatic ring.

A π-π interaction may be formed between the graphene layer 200 and the organic linker layer 300. The π-π interaction is a relatively weak intermolecular chemical interaction formed between plate-shaped ring structures, unlike a relatively strong interatomic chemical interaction. In detail, pi orbital electrons may exist in the plate-shaped ring structure. The plate-shaped ring structures may be flat stacked by force of the pi orbital electrons to form a relatively weak pi-conjugation. The graphene layer 200 is an allotrope of a carbon nano-material and has a structure in which two-dimensional honeycomb-shaped ring structures are densely arranged in the form of a plate. The organic linker layer 300 formed of the 4MP includes the aromatic element having the thiol group and the hydroxyl group as described with reference to FIGS. 1 and 3, and the organic linker layer 300 has a structure in which ring structures are densely arranged in the form of a plate. Thus, as illustrated in FIG. 4, the π-π interaction may be formed by the pi-conjugation between the graphene layer 200 having the plate-shaped ring structure and the organic linker layer 300 having the plate-shaped ring structure. In other words, a structure in which the organic linker layer 300 is flat stacked on the graphene layer 200 (π-π stacking) may be formed by the π-π interaction formed between the graphene layer 200 and the organic linker layer 300. As a result, the organic linker layer 300 may be formed on the graphene layer 200 by a non-destructive method, and thus the graphene layer 200 may be functionalized. In detail, destruction of the honeycomb-shaped crystal structure of the graphene layer 200 may be prevented, and thus it is possible to prevent defects from being generated in the crystal structure when a dopant material is provided on the graphene layer 200. As a result, it is possible to prevent a charge carrier mobility from being reduced by defects in the graphene layer 200. In addition, it is possible to prevent a surface roughness value of the graphene layer 200 from increasing.

On the other hand, the organic linker layer 300 may be simply physically adsorbed on the second portion 100b on which the graphene layer 200 is not provided. The top surface of the second portion 100b on which the graphene layer 200 is not provided may be a top surface of the substrate 100 and may be a top surface of the silicon-based substrate, as described above. The silicon-based substrate does not have the plate-shaped ring structure which forms the π-π interaction with the organic linker layer 300. Thus, the π-π interaction is not formed between the organic linker layer 300 and the second portion 100b on which the graphene layer 200 is not provided.

Referring to FIG. 5, the organic linker layer 300 formed on the second portion 100b on which the graphene layer 200 is not provided may be removed. In detail, the organic linker layer 300 formed on the second portion 100b may be easily removed by a purge process before a dopant material is provided on the organic linker layer 300 in the ALD chamber by an ALD process. In addition, the 4MP which is generated in the vapor deposition process and remains in a vapor form in the ALD chamber may also be removed by the purge process. For example, a purge gas used in the purge process may be an argon (Ar) gas. For example, the purge process may be performed for 10 seconds.

On the contrary, the organic linker layer 300 on the graphene layer 200 may form the π-π interaction with the graphene layer 200 and thus may not be removed by the purge process of the ALD process. In other words, before the dopant material is provided on the organic linker layer 300, the organic linker layer 300 provided on the second portion 100b may be removed by the purge process of the ALD process but the organic linker layer 300 on the graphene layer 200 may remain after the purge process.

Referring to FIGS. 1 and 6, a dopant layer 400 may be formed by providing a dopant material including a metal on the organic linker layer 300 (S300). The organic linker layer 300 and the dopant layer 400 may be formed in-situ. The organic linker layer 300 may be formed in the ALD chamber by the vapor deposition process, and then, the dopant layer 400 may be continuously formed in the ALD chamber by the ALD process. Thus, the processes may be simplified to reduce a process time and a process cost. For example, the 4MP in the vapor form may be supplied into the ALD chamber for 10 seconds. According to an embodiment, as a time for which the organic linker is provided on the graphene layer 200 increases, a contact angle of the dopant layer 400 with respect to water may decrease and an absorbance of the dopant layer 400 with respect to ultraviolet (UV) may increase.

Sulfur (S) included in the thiol group of the organic linker and oxygen (O) included in the hydroxyl group of the organic linker may be combined with the metal included in the dopant layer 400. Since sulfur (S) and oxygen (O) of the organic linker are chemically combined with the metal of the dopant layer 400, the dopant layer 400 may be stably formed on the organic linker layer 300.

In addition, the dopant layer 400 may be conformally formed on the organic linker layer 300 due to the structure in which the organic linker layer 300 is flat stacked on the graphene layer 200. Furthermore, sulfur (S) of the organic linker may be combined with the metal of the dopant layer 400, as described above. Thus, air stability of the graphene layer 200 may be improved. According to an embodiment, the dopant material including the metal may be a zinc oxide including zinc. Alternatively, in other embodiments, the dopant material including the metal may be one of a transition metal oxide (e.g., ZnO, $TiO_2$, $SnO_2$, $MoO_3$, $Fe_2O_3$, indium gallium zinc oxide (IGZO), NiO, CoO, FeO, MnO, $Cu_2O$, or CdO), a transition metal sulfide (e.g., ZnS, $Sb_2S_3$, SnS, NiS, $WS_2$, $MoS_2$, $TiS_2$, $Cu_2S$, or CdS), and a metal (e.g., Cu, Ni, W, Mo, Ru, or Ag).

The formation of the dopant layer 400 on the organic linker layer 300 by the ALD process may include supplying a precursor of the dopant material into the ALD chamber, purging the inside of the ALD chamber to remove the precursor of the dopant material remaining in the ALD chamber, supplying a reactant of the dopant material into the ALD chamber, and purging the inside of the ALD chamber to remove the reactant of the dopant material remaining in the ALD chamber. Supplying the precursor of the dopant material into the ALD chamber, purging the inside of the ALD chamber to remove the precursor of the dopant material remaining in the ALD chamber, supplying the reactant of the dopant material into the ALD chamber, and purging the inside of the ALD chamber to remove the reactant of the dopant material remaining in the ALD chamber may be defined as a unit process. The number of times the unit process is repeatedly performed may be adjusted to adjust a thickness of the dopant layer 400 formed on the organic linker layer 300. The thickness of the dopant layer 400 may be adjusted in the unit of angstrom.

In an embodiment, when the dopant material including the metal is zinc oxide, the precursor of the dopant material may be diethyl zinc (DEZ), and the reactant of the dopant material may be deionized water ($H_2O$).

The graphene layer 200 may be doped with the metal included in the dopant layer 400. In detail, when the metal is zinc as described above, the graphene layer 200 may be doped in an N-type. According to an embodiment of the inventive concepts, a doping level of the graphene layer 200 may be adjusted by adjusting the thickness of the dopant layer 400. Thus, a Fermi level of the graphene layer 200 may be adjusted. In more detail, the Fermi level may increase as the thickness of the dopant layer 400 increases. In addition, since the thickness of the dopant layer 400 is adjusted in the unit of angstrom as described above, the doping level of the graphene layer 200 may be precisely adjusted. Thus, it is possible to provide or realize the functionalized graphene structure of which electrical characteristics can be precisely adjusted, and the method for manufacturing the same.

Unlike the aforementioned embodiments of the inventive concepts, if carbon (C) of graphene is replaced with boron (B), nitrogen (N) or phosphorus (P) to adjust electrical characteristics of the graphene, a honeycomb-shaped crystal structure of the graphene may be destroyed and defects may be generated in the crystal structure of the graphene. Thus, a charge carrier mobility of the graphene may be reduced. In addition, if a functional layer (e.g., organic molecules, polymer, nanoparticles, a metal thin layer, or an inorganic thin layer) is formed on a surface of the graphene to adjust electrical characteristics of the graphene, the honeycomb-shaped crystal structure of the graphene may not be destroyed but the functional layer may be vulnerable to air and may be unstable. In addition, the functional layer may not be conformally formed on the graphene, and thus it may have a rough surface. Thus, the graphene having the functional layer may absorb oxygen and/or moisture in air to deteriorate electrical characteristics of the graphene. Therefore, reliability of the graphene may be deteriorated.

However, according to the aforementioned embodiments of the inventive concepts, the organic linker layer 300 may be formed on the graphene layer 200, and then, the dopant layer 400 including the metal may be formed on the organic linker layer 300. Since the organic linker layer 300 is formed on the graphene layer 200 by the π-π interaction, it is possible to prevent the honeycomb-shaped crystal structure of the graphene layer 200 from being destroyed. Thus, it is possible to prevent defects from being generated in the crystal structure of the graphene layer 200. In addition, the dopant layer 400 may be conformally formed on the graphene layer 200. Since the organic linker layer 300 is formed on the graphene layer 200 as described above, reduction in the charge carrier mobility of the graphene layer 200 and an increase in the surface roughness of the dopant layer 400 may be prevented even though the dopant layer 400 is formed on the graphene layer 200. As a result, the air stability of the graphene layer 200 may be increased, and thus the electrical characteristics of the graphene layer 200 may be improved and the reliability of the graphene layer 200 may also be improved.

In addition, since the organic linker layer 300 and the dopant layer 400 are formed in-situ on the graphene layer 200, the manufacturing processes may be simplified to reduce the process time and the process cost. Furthermore, since the dopant layer 400 is formed by the ALD process, the thickness of the dopant layer 400 may be adjusted in the unit of angstrom by adjusting the number of times the unit process of the ALD process is performed. Thus, the electrical characteristics of the graphene layer 200 may be easily adjusted by adjusting the thickness of the dopant layer 400.

Evaluation results of characteristics of the functionalized graphene structure manufactured according to the aforementioned embodiments of the inventive concepts will be described hereinafter.

FIG. 7 shows atomic force microscope (AFM) images of a graphene structure in which a dopant layer is formed on a graphene layer where an organic linker layer is not formed.

In detail, an AFM image (a) of FIG. 7 shows a graphene structure where an organic linker layer is not formed, and an AFM image (b) of FIG. 7 shows a case in which a dopant layer is formed on a graphene structure where an organic linker layer is not formed.

FIG. 8 shows AFM images of a functionalized graphene structure in which a dopant layer is formed on a graphene layer where an organic linker layer is formed. In detail, an AFM image (a) of FIG. 8 shows a graphene structure where an organic linker layer is not formed, and an AFM image (b) of FIG. 8 shows a functionalized graphene structure.

Graphene flakes separated from kish graphite by mechanical cutting of a scotch tape method were formed on a $SiO_2/p+Si$ wafer substrate having a thickness of 300 nm to manufacture a substrate having a graphene layer. Here, the substrate having the graphene layer included a first portion on which the graphene layer was provided, and a second portion on which the graphene layer was not provided. The substrate having the graphene layer was annealed at 350 degrees Celsius for 1 hour in an argon gas environment to remove a remaining material of an adhesive tape and/or a contaminant, generated on a surface of the graphene layer. The manufactured substrate having the graphene layer was disposed in an ALD chamber, and then, 4MP corresponding to an organic linker was deposited on the graphene layer through a vapor deposition process to form an organic linker layer on the graphene layer. In the vapor deposition process, a temperature at which the 4MP was vaporized was 85 degrees Celsius and the 4MP in the vapor form was provided into the ALD chamber for 10 seconds.

After the organic linker layer was formed on the graphene layer, the inside of the ALD chamber was purged using an argon (Ar) gas to remove the 4MP remaining in the vapor form in the ALD chamber and the organic linker layer formed on the second portion where the graphene layer was not provided. A dopant layer was formed on the graphene layer, on which the 4MP was formed, by the ALD process. Thus, the functionalized graphene structure was manufactured. To form the dopant layer, diethyl zinc (DEZ) was used as the precursor of the dopant material (ZnO) provided into the ALD chamber, and deionized water ($H_2O$) was used as the reactant of the dopant material provided into the ALD chamber. A temperature at which the precursor of the dopant material was vaporized was 25 degrees Celsius. In the ALD process, the unit process (1 cycle) included supplying DEZ into the ALD chamber (2 seconds), performing a purge process using an argon gas (60 seconds), supplying $H_2O$ (2 seconds), and performing a purge process using an argon gas (90 seconds). A thickness of the dopant layer was adjusted by adjusting the number of times the unit process (i.e., 1 cycle) was repeatedly performed. A growth rate of the dopant layer on the graphene layer on which the 4MP was formed was 1 Å/cycle.

A surface image of a graphene structure in which a dopant layer was formed on a graphene layer not having an organic linker layer was obtained using an atomic force microscope (AFM), and a surface image of the functionalized graphene structure in which the dopant layer was formed on the organic linker layer formed on the graphene layer was obtained using the AFM.

Referring to the AFM images (a) and (b) of FIG. 7, in the graphene structure in which the dopant layer is formed on the graphene layer on which the organic linker layer is not formed, an increase in surface height of the first portion (of the substrate) on which the graphene layer is provided is not equal to an increase in surface height of the second portion (of the substrate) on which the graphene layer is not provided. A height of the graphene structure corresponding to the first portion on which the graphene layer is provided is lower than a height of the graphene structure corresponding to the second portion on which the graphene layer is not provided. Thus, it is difficult to form the dopant layer on the graphene layer on which the organic linker layer is not formed.

Referring to the AFM images (a) and (b) of FIG. 8, in the functionalized graphene structure, an increase in surface height of the first portion (of the substrate) on which the graphene layer is provided is substantially equal to an increase in surface height of the second portion (of the substrate) on which the graphene layer is not provided. As a result, the graphene layer is functionalized by the organic linker layer, and thus the dopant layer is easily formed on the graphene layer in the same manner as the dopant layer is formed on the second portion of the substrate.

FIG. 9 shows X-ray photoelectron spectroscopy (XPS) graphs of a graphene structure having an organic linker layer and a functionalized graphene structure. In detail, a graph (a) of FIG. 9 is an XPS graph of the graphene structure in which the organic linker layer is formed, and graphs (b), (c) and (d) of FIG. 9 are XPS graphs of the functionalized graphene structure.

An emission intensity according to a binding energy of internal atoms in the graphene structure having the organic linker layer was measured using an X-ray photoelectron spectroscopy (XPS) apparatus, and an emission intensity according to a binding energy of internal atoms in the functionalized graphene structure was measured using the XPS apparatus.

Referring to the graph (a) of FIG. 9, in the graphene structure in which the organic linker layer is formed, emission intensity peaks corresponding to sulfur (S) included in the thiol group of 4MP (i.e., the organic linker) are shown at binding energy values of $S2P_{1/2}$ (164.96 eV) and $S2P_{3/2}$ (163.85 eV). Thus, it is recognized that the organic linker layer is formed on the graphene layer.

Referring to the graphs (b), (c) and (d) of FIG. 9, in the functionalized graphene structure, the emission intensity peaks of sulfur (S) of the 4MP shown at the binding energy values of $S2P_{1/2}$ (164.96 eV) and $S2P_{3/2}$ (163.85 eV) as described in the graph (a) of FIG. 9 are shifted to a lower binding energy value (about 162 eV). The fact that the emission intensity peak of sulfur (S) of the 4MP is shifted to the lower binding energy value may result from the interaction between sulfur (S) of the 4MP and ZnO of the dopant layer.

FIG. 10 shows XPS graphs of a graphene structure in which an organic linker layer is not formed, a graphene structure in which an organic linker layer is formed, and a functionalized graphene structure.

By using the method described with reference to FIGS. 7 and 8, a graphene structure in which the organic linker layer was not formed was manufactured, a graphene structure in which the organic linker layer was formed was manufactured, and functionalized graphene structures of which dopant layers had different thicknesses (2 nm, 4 nm and 6 nm) were manufactured.

An emission intensity according to a binding energy of internal atoms of the graphene structure in which the organic linker layer was not formed was measured using an XPS apparatus, an emission intensity according to a binding energy of internal atoms of the graphene structure in which the organic linker layer was formed was measured using the XPS apparatus, and emission intensities according to binding energies of internal atoms of the functionalized graphene structures including the dopant layers having the different thicknesses (2 nm, 4 nm and 6 nm) were measured using the XPS apparatus.

Referring to a graph (a) of FIG. 10, in the graphene structure in which the organic linker layer is not formed, an emission intensity peak corresponding to sulfur (S) of the 4MP is not shown at the binding energy values of $S2p_{1/2}$ (164.96 eV) and $S2p_{3/2}$ (163.85 eV) described with reference to FIG. 9.

On the contrary, in the graphene structure in which the organic linker layer is formed, an emission intensity peak is shown at a binding energy value of about 164 eV similar to the binding energy value at which the emission intensity peak of sulfur (S) of the 4MP is shown. Thus, it is recognized that the organic linker layer is formed on the graphene layer.

In addition, in the functionalized graphene structures, emission intensity peaks corresponding to sulfur (S) of the 4MP are shifted to a lower binding energy value by the interaction between sulfur (S) of the 4MP and ZnO of the dopant layers as described with reference to FIG. 9, and thus the emission intensity peaks are shown at a binding energy value of about 162 eV.

Referring to a graph (b) of FIG. 10, a C1s emission intensity peak (284.40 eV) corresponding to carbon (C) of the graphene layer of the graphene structure having the organic linker layer is shown at a binding energy value lower than a binding energy value at which a C1s emission intensity peak (284.45 eV) of the graphene structure not having the organic linker layer is shown. The fact that the binding energy value of the C1s emission intensity peak of the graphene structure having the organic linker layer is shifted to a value lower than the binding energy value of the C1s emission intensity peak of the graphene structure not having the organic linker layer may result from the graphene layer doped in a P-type by the 4MP (i.e., the organic linker).

In addition, in the functionalized graphene structures, a binding energy value at which a C1s emission intensity peak of the graphene layer is shown increases in the order of 284.40 eV, 284.55 eV, 284.7 eV, and 284.95 eV as the thickness of the dopant layer formed on the graphene layer increases in the order of 0 nm, 2 nm, 4 nm, and 6 nm. The fact that the binding energy value at which the C1s emission intensity peak of the graphene layer is shown increases as the thickness of the dopant layer on the graphene layer increases may result from electrons donated from ZnO of the dopant layer into the graphene layer. In addition, the N-type doping of the graphene layer may increase a Fermi level of the graphene layer.

Referring to a graph (c) of FIG. 10, Si2p emission intensity peaks of silicon (Si) of the $SiO_2$/p+Si wafer substrates of all of the graphene structure not having the organic linker layer, the graphene structure having the organic linker layer and the functionalized graphene structures are shown at substantially the same binding energy value. This may be because most of charges are transferred between graphene of the graphene layer and ZnO of the dopant layer in each of the graphene structure not having the organic linker layer, the graphene structure having the organic linker layer, and the functionalized graphene structures.

FIG. 11 shows a Raman spectra graph of a graphene structure in which an organic linker layer is not formed, a graphene structure in which an organic linker layer is formed, and a functionalized graphene structure.

By using the method described with reference to FIGS. 7 and 8, the graphene structure in which the organic linker layer was not formed was manufactured, the graphene structure in which the organic linker layer was formed was manufactured, and the functionalized graphene structures of which the dopant layers had different thicknesses (2 nm, 4 nm and 6 nm) were manufactured.

Emission intensity peak values according to a Raman shift value of the graphene structure not having the organic linker layer, the graphene structure having the organic linker layer, and the functionalized graphene structures were measured using a Raman spectroscope.

Referring to FIG. 11, an emission intensity peak value (1586.8) of a G peak showing a carrier concentration of graphene of the graphene layer of the functionalized graphene structure including the dopant layer having the thickness of 2 nm is the smallest value. This may be because the graphene layer is doped in a P-type by moisture and oxygen in air and/or charge impurities on a $SiO_2$ surface of the $SiO_2$/p+Si wafer substrate.

In addition, a G peak showing graphene and a D peak showing defects of the graphene structure having the organic linker layer is shifted up from those of the graphene structure not having the organic linker layer. This may be because holes are transferred from the 4MP to the graphene layer (i.e., P-doping) as described with reference to FIG. 10.

Furthermore, as the thickness of the dopant layer formed on the graphene layer increases, the G peak of the functionalized graphene structure increases and the D peak of the functionalized graphene structure decreases. This may be because electrons are transferred from ZnO of the dopant layer into graphene of the graphene layer (N-doping) and a concentration of electrons increases as the thickness of the dopant layer formed on the graphene layer increases.

FIG. 12 is a graph showing $I_{2D}/I_G$ in Raman spectra of a graphene structure in which an organic linker layer is not formed, a graphene structure in which an organic linker layer is formed, and a functionalized graphene structure.

Ratios of the D peak values and the G peak values of the graphene structure not having the organic linker layer, the graphene structure having the organic linker layer, and the functionalized graphene structures were calculated from the results of FIG. 11.

Referring to FIG. 12, since the emission intensity peak value (1586.8) of the G peak of the functionalized graphene structure including the dopant layer having the thickness of 2 nm is the smallest value as described with reference to FIG. 11, an $I_{2D}/I_G$ value thereof is the largest value. In addition, as the thickness of the dopant layer formed on the graphene layer increases, the G peak value increases but the D peak value decreases, as described above. Thus, the $I_{2D}/I_G$ value decreases as the thickness of the dopant layer increases.

FIGS. 13 and 14 are graphs showing transfer curves of a graphene thin film transistor (TFT) according to an increase in thickness of the dopant layer of the functionalized graphene structure. In detail, FIG. 13 is a graph showing transfer curves of graphene TFTs in which thicknesses of dopant layers of functionalized graphene structures according to embodiments of the inventive concepts are 0 nm, 1 nm, 2 nm, 4 nm, 6 nm, and 9 nm, respectively. FIG. 14 is a graph showing transfer curves of graphene TFTs in which thicknesses of dopant layers of functionalized graphene structures according to embodiments of the inventive concepts are 1.8 nm, 2 nm, and 2.2 nm, respectively.

The functionalized graphene structure was manufactured, and a graphene TFT was manufactured using Ti/Au as source and drain electrodes. The graphene TFT was disposed in the ALD chamber, and then, the 4MP (i.e., the organic linker) was deposited on the graphene layer through the vapor deposition process. Subsequently, the ALD process was performed to form the dopant layer on the graphene layer on which the 4MP was deposited. At this time, the thickness of the dopant layer was adjusted to manufacture the graphene TFTs which included the dopant layers having the thicknesses of 0 nm, 1 nm, 1.8 nm, 2 nm, 2.2 nm, 4 nm, 6 nm, and 9 nm, respectively. As described with reference to FIGS. 7 and 8, graphene flakes (the graphene layer) mechanically cut and separated were used as a channel. A gate voltage $V_G$ of the graphene TFT was measured in a state where a drain voltage of the graphene TFT was maintained at 0.1V.

A Fermi level value $E_f$ of the graphene layer of the graphene TFT was calculated using the following equation 1. In the following equation 1, "$V_{Dirac}$" (DPs) is a value measured from the transfer curve of the graphene TFT, "$V_f$" is a Fermi viscosity value (5.28 eVÅ), "$C_{ox}$" is a gate capacitance value ($1.15 \times 10^{-8}$ Fcm$^{-2}$), "e" is an elementary charge value ($1.6 \times 10^{-19}$C), and "$V_G$" is a $V_G$ measurement value of the graphene TFT.

$$E_f = hV_f(\pi C_{ox}(V_G - V_{Dirac})/e)^{1/2}$$ [Equation 1]

Referring to FIG. 13, in the case in which the thickness of the dopant layer is 0 nm (i.e., the graphene structure in which the organic linker layer is formed), the $V_G$ value of the graphene TFT is 22V. This may result from the P-doping of the graphene layer as described with reference to FIG. 11. In addition, the $V_G$ value decreases in the order of 8V, 0V, −15.8V, −28V, and −28.8V as the thickness of the dopant layer increases in the order of 1 nm, 2 nm, 4 nm, 6 nm, and 9 nm. In other words, it is recognized that the $V_G$ value (DP voltage value) of the graphene TFT decreases as the thickness of the dopant layer increases. The fact that the $V_G$ value of the graphene TFT decreases as the thickness of the dopant layer increases may result from the graphene layer doped in the N-type by ZnO of the dopant layer. As a result, a degree of N-doping of the graphene layer may be adjusted by adjusting the thickness of the dopant layer, and thus electrical characteristics of the graphene TFT may be adjusted.

Referring to FIG. 14, the $V_G$ value decreases in the order of 1V, 0, and −1V as the thickness of the dopant layer increases in the order of 1.8 nm, 2 nm, and 2.2 nm. In other words, even though an increase in thickness of the dopant layer is small, the electrical characteristics of the graphene TFT may be adjusted.

FIG. 15 is a graph showing a transfer curve of a graphene TFT manufactured using a graphene structure in which an organic linker layer is formed.

The graphene structure not having the organic linker layer and the graphene structure having the organic linker layer were manufactured, and then, the source and drain electrodes were formed on the graphene layers to manufacture graphene TFTs, as described with reference to FIGS. 13 and 14. $V_G$ values of the graphene TFTs were measured in a state where drain voltages of the graphene TFTs were maintained at 0.1V.

Referring to FIG. 15, the $V_G$ value of the graphene TFT manufactured using the graphene structure having the organic linker layer is greater than the $V_G$ value of the graphene TFT manufactured using the graphene structure not having the organic linker layer. This may result from the P-doping of the graphene layer as described with reference to FIG. 11.

FIG. 16 is a graph showing a hole concentration and an electron concentration according to a thickness of a dopant layer of a functionalized graphene structure.

Referring to FIG. 16, a hole concentration of the graphene layer of the functionalized graphene structure decreases in the order of $1.58 \times 10^{12}$ cm$^{-2}$, $5.76 \times 10^{11}$ cm$^{-2}$, and $7.2 \times 10^{10}$ cm$^{-2}$ as the thickness of the dopant layer increases in the order of 0 nm, 1 nm, and 1.8 nm. In addition, an electron concentration of the graphene layer of the functionalized graphene structure increases from $7 \times 10^{10}$ cm$^{-2}$ to $2.07 \times 10^{12}$ cm$^{-2}$ as the thickness of the dopant layer increases from 2.2 nm to 6 nm. The electron concentration of the graphene layer when the thickness of the dopant layer is 9 nm is substantially equal to the electron concentration of the graphene layer when the thickness of the dopant layer is 6 nm. As a result, a doping type of the graphene layer may be determined by adjusting the thickness of the dopant layer of the functionalized graphene structure, and the hole concentration and the electron concentration of the graphene layer may be adjusted by adjusting the thickness of the dopant layer of the functionalized graphene structure.

FIG. 17 is a graph showing a hole mobility and an electron mobility according to a thickness of a dopant layer of a functionalized graphene structure.

Referring to FIG. 17, as the thickness of the dopant layer increases, a hole mobility of the graphene layer of the functionalized graphene structure decreases and an electron mobility of the graphene layer increases. However, the hole mobility and the electron mobility of the graphene layer when the thickness of the dopant layer is 9 nm are substantially equal to the hole mobility and the electron mobility of the graphene layer when the thickness of the dopant layer is 6 nm.

FIG. 18 shows AFM images of a functionalized graphene structure according to a time of an organic linker surface treatment. In detail, images (a), (b), (c), (d) and (e) of FIG. 18 are AFM images of functionalized graphene structures manufactured by performing organic linker surface treatments on graphene layers for 0 second, 1 second, 3 seconds, 5 seconds, and 10 seconds, respectively.

A CVD graphene film (graphene layer) obtained from graphene Square® was formed on a p+Si substrate on which SiO$_2$ of 300 nm was formed. The organic linker surface treatments were performed on the graphene layers for 0 second, 1 second, 3 seconds, 5 seconds, and 10 seconds, respectively, and thus the 4MP (i.e., the organic linker) was deposited on each of the graphene layers. The ALD process was performed for 50 cycles to form the dopant layer on each graphene layer on which the 4MP was deposited, thereby manufacturing the functionalized graphene structure.

Surface shape images of the functionalized graphene structures manufactured by performing the organic linker surface treatments for different times were obtained using the AFM.

Referring to FIG. 18, a surface of the functionalized graphene structure becomes cleaner as the time for which the organic linker surface treatment is performed on the graphene layer increases. As a result, the graphene layer may be functionalized as the time for which the organic linker surface treatment is performed on the graphene layer increases, and thus the dopant layer may be conformally formed on the graphene layer.

FIG. 19 is a graph showing a water contact angle of a graphene layer according to a time of an organic linker surface treatment and an UV-VIS absorbance of a functionalized graphene structure according to the time of the organic linker surface treatment.

The graphene layer on which the 4MP was deposited was manufactured as described with reference to FIG. 18, and then, a contact angle of the graphene layer with respect to water was measured. In addition, the ALD process was performed for 50 cycles on the graphene layer having the deposited 4MP to manufacture the functionalized graphene structure, and then, an UV-VIS absorbance according to the time of the organic linker surface treatment was measured.

Referring to FIG. 19, the contact angle with respect to water of the graphene layer having the deposited 4MP decreases as the time of the organic linker surface treatment increases. This may be because active groups (—OH and —SH) of the 4MP on a surface of the graphene layer are increased to increase a surface energy of the graphene layer as the time of the organic linker surface treatment increases. In addition, the contact angle of the graphene layer with respect to water when the time of the organic linker surface treatment is 10 seconds is substantially equal to the contact angle of the graphene layer with respect to water when the time of the organic linker surface treatment is 20 seconds.

As shown in FIG. 19, the UV-VIS absorbance of the functionalized graphene structure increases as the time of the organic linker surface treatment increases. In addition, the UV-VIS absorbance when the time of the organic linker surface treatment is 10 seconds is substantially equal to the UV-VIS absorbance when the time of the organic linker surface treatment is 20 seconds. Thus, an UV absorbance of the functionalized graphene structure is saturated when the time of the organic linker surface treatment is 10 seconds or more. In addition, to conformally form the dopant layer on an entire surface of the graphene layer, the graphene layer is completely functionalized by the 4MP.

FIGS. 20 and 21 are graphs showing test results of stability in air of a graphene TFT manufactured using the functionalized graphene structure. In detail, FIG. 20 is a graph showing a drain current $I_D$ versus a gate voltage $V_G$ over time of the graphene TFT, and FIG. 21 is a graph showing an electron mobility and $V_{Dirac}$ over time of the graphene TFT.

The source and drain electrodes were formed on the functionalized graphene structure to manufacture the graphene TFT, as described with reference to FIGS. 13 and 14. Here, the dopant layer having a thickness of 6 nm was formed on the graphene layer, on which the 4MP was deposited, of the functionalized graphene structure. To check the stability in air of the graphene TFT, the drain current $I_D$ versus the gate voltage $V_G$ of the graphene TFT was measured for 60 days. In addition, the electron mobility and the $V_{Dirac}$ value of the graphene TFT were measured for 60 days.

Referring to FIG. 20, the drain current $I_D$ versus the gate voltage $V_G$ of the graphene TFT is not significantly changed over 30 days.

As shown in FIG. 21, the electron mobility of the graphene TFT slightly decreases from 4720 $cm^2V^{-1}s^{-1}$ to 4350 $cm^2V^{-1}s^{-1}$ over 30 days, and the $V_{Dirac}$ value of the graphene TFT slightly increases from −30.4V to −27.6V over 30 days.

As the results of FIGS. 20 and 21, the dopant layer formed of ZnO of an inorganic material is conformally and densely formed on the graphene layer functionalized by the deposition of the 4MP, thereby improving the stability in air of the graphene TFT manufactured using the functionalized graphene structure. Thus, electrical characteristics of the graphene TFT may be maintained for at least 30 days without a significant change.

According to the aforementioned embodiments of the inventive concepts, the organic linker layer may be formed on the graphene layer by the π-π interaction, and then, the dopant layer including the metal may be formed on the organic linker layer to manufacture the functionalized graphene structure. In the functionalized graphene structure, defects in the graphene layer may be minimized and the dopant layer may be conformally formed on the graphene layer. Thus, it is possible to prevent reduction in charge carrier mobility of the graphene layer and an increase in surface roughness of the dopant layer. In addition, the graphene TFT which has the excellent air stability and maintains the electrical characteristics of the graphene layer may be manufactured using the functionalized graphene structure. Furthermore, since the dopant layer is formed by the atomic layer deposition (ALD) process, the thickness of the dopant layer may be adjusted in the unit of angstrom. Thus, the electrical characteristics of the graphene layer may be easily adjusted by adjusting the thickness of the dopant layer.

While the inventive concepts have been described with reference to exemplary embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for manufacturing a functionalized graphene structure, the method comprising:
   preparing a substrate having a graphene layer;
   forming an organic linker layer by providing an organic linker on the graphene layer; and
   forming a dopant layer by providing a dopant material including a metal on the organic linker layer,
   wherein the organic linker layer and the dopant layer are formed in-situ,
   wherein the organic linker comprises an aromatic element having a thiol group and a hydroxyl group.

2. The method of claim 1, wherein the graphene layer is functionalized by the organic linker layer such that the dopant layer is conformally formed on the graphene layer.

3. The method of claim 1, wherein the organic linker is 4-mercaptophenol (4MP).

4. The method of claim 1, wherein sulfur (S) included in the thiol group and oxygen (O) included in the hydroxyl group of the organic linker are combined with the metal included in the dopant layer.

5. The method of claim 1, wherein the substrate comprises: a first portion on which the graphene layer is provided; and a second portion on which the graphene layer is not provided,
   wherein the forming of the organic linker layer by providing the organic linker on the graphene layer comprises:
   forming the organic linker layer on the graphene layer and the second portion.

6. The method of claim 5, wherein the organic linker layer formed on the second portion is removed by a purge process before the dopant material is provided on the organic linker layer by an atomic layer deposition (ALD) process, and the organic linker layer on the graphene layer remains after the purge process.

7. The method of claim 1, wherein the dopant material including the metal includes zinc.

8. The method of claim 1, wherein the forming of the dopant layer comprises:
   adjusting a thickness of the dopant layer in the unit of angstrom.

9. The method of claim 1, wherein a contact angle of the dopant layer with respect to water decreases as a time for which the organic linker is provided on the graphene layer increases.

10. The method of claim 1, wherein an absorbance of the dopant layer with respect to ultraviolet (UV) increases as a time for which the organic linker is provided on the graphene layer increases.

11. A functionalized graphene structure comprising:
a substrate;
a graphene layer on the substrate;
a layer comprising an organic linker (organic linker layer) and disposed on the graphene layer, said organic linker layer having a π-π interaction with the graphene layer; and
a dopant layer on the organic linker layer,
wherein the organic linker comprises an aromatic element having a thiol group and a hydroxyl group.

12. The functionalized graphene structure of claim 11, wherein the organic linker layer is provided between the graphene layer and the dopant layer.

13. The functionalized graphene structure of claim 12, wherein the substrate comprises: a first portion on which the graphene layer is provided; and a second portion on which the graphene layer is not provided, and
wherein the dopant layer is provided on the first portion and the second portion of the substrate.

14. The functionalized graphene structure of claim 11, wherein a Fermi level of the graphene layer is adjusted according to a thickness of the dopant layer.

15. The functionalized graphene structure of claim 11, wherein the organic linker is 4-mercaptophenol (4MP).

* * * * *